United States Patent
Hong et al.

[19]

[11] Patent Number: 6,099,302
[45] Date of Patent: Aug. 8, 2000

[54] SEMICONDUCTOR WAFER BOAT WITH REDUCED WAFER CONTACT AREA

[75] Inventors: Ji-hoon Hong; Ki-heum Nam, both of Kyungki-do, Rep. of Korea

[73] Assignee: Samsung Electronics Co., Ltd., Suwon, Rep. of Korea

[21] Appl. No.: 09/337,673

[22] Filed: Jun. 22, 1999

[30] Foreign Application Priority Data

Jun. 23, 1998 [KR] Rep. of Korea ...................... 98-23770

[51] Int. Cl.[7] .................................................. F27D 5/00
[52] U.S. Cl. ...................... 432/259; 432/258; 211/41.18
[58] Field of Search ................................... 432/253, 258, 432/259; 211/41.18

[56] References Cited

U.S. PATENT DOCUMENTS 4,407,654  10/1983  Irwin .......................................... 432/258
5,310,339  5/1994  Ushikawa ................................. 432/253
5,718,574  2/1998  Shimazu .................................. 432/253
5,820,367  10/1998  Osawa ..................................... 432/253
5,931,666  8/1999  Hengst .................................... 432/258

*Primary Examiner*—Denise L. Ferensic
*Assistant Examiner*—Gregory A. Wilson
*Attorney, Agent, or Firm*—Jones Volentine, LLP

[57] ABSTRACT

A boat for semiconductor wafers has reduced contact surface area with the wafer, thereby preventing distortion of the wafer during heating. The boat has an upper member; a lower member, a plurality of wafers being loaded between the upper member and the lower member; and a plurality of support members vertically extended between and connecting the upper member to the lower member for supporting the wafers. A plurality of slots are successively and horizontally formed in each of the support members, and the peripheral edge of the wafer is inserted therein, wherein a hemisphere-shaped protrusion is formed inside the slot, and the bottom surface of the wafer contacts and is supported by each hemisphere-shaped protrusion at a single contact point.

6 Claims, 9 Drawing Sheets

SEMICONDUCTOR WAFER BOAT WITH REDUCED WAFER CONTACT AREA

BACKGROUND OF THE INVENTION

1. Field of the Invention

The present invention relates to a boat for housing semiconductor wafers, and more particularly, to a boat for semiconductor wafers for reducing the contact surface between the boat and the wafers.

2. Background of the Related Art

Generally, in semiconductor device fabrication, various processes are repeatedly carried out using primary and supplementary equipment.

A semiconductor wafer boat is used as a container for housing semiconductor wafers inside the above-mentioned semiconductor device fabrication equipment, and for loading or unloading semiconductor wafers to other fabrication equipment while housing a plurality of wafers therein.

The semiconductor wafer boat is made of a quartz material which is able to withstand the harsh fabrication environments encountered during processing, for example, a high temperature environment in a diffusion process in which an oxide layer is deposited on the wafer, or an implantation process in which boron (B) or phosphorus (P) is implanted in the wafer substrate to achieve certain electrical characteristics.

FIG. 1 shows a conventional semiconductor wafer boat which comprises: an upper member 2 and a lower member 3, between which a plurality of wafers 1 are loaded; a plurality of support members 4 for connecting the upper member 2 and the lower member 3; and a plurality of slots 5 formed in the support members 4 for supporting a wafer 1 at its peripheral edge inserted into the slots 5.

FIG. 2 shows the bottom of the wafer loaded in the boat in FIG. 1, with the areas 6 indicating the contact surface between the wafer and the boat. As shown in FIG. 2, the contact surface areas 6 have a semicircular shape.

FIG. 3 shows another conventional semiconductor wafer boat which comprises: an upper member 7 and a lower member 8 between which a plurality of wafers 1 are loaded; a plurality of support members 9 for connecting the upper member 7 and the lower member 8; and a plurality of mounting plates 10 each of which is ring-shaped for mounting a wafer 1 thereon. The wafer 1 mounted on the mounting plate 10 has a ring-shaped contact surface 11 as shown in FIG. 4.

However, a "slip" phenomenon often occurs on the wafer 1 in the conventional semiconductor wafer boats, which is caused by the contact surfaces 6 and 11 as shown in FIGS. 2 and 4. This "slip" results when fine scratches generated at the contact surface between the wafer and the boat produce crystal dislocation or cracks on the surface of the wafer.

More specifically, small vibrations often occur in the boat. Contact friction between the wafer 1 and its contacting slot 6 or mounting plate 11, having different thermal expansion coefficients, causes fine scratches on the surface of the wafer, which leads to crystal dislocation, surface distortions or cracks in the wafer. Such crystal dislocation, surface distortions or cracks are referred to as "slip".

Other contributing factors that influence the degree or severity of "slip" include high temperature processing conditions (over about 900° C.), high heating rates inside a process chamber, too narrow a gap between the slots of the boat or between the mounting plates, or excessive upward/downward speed of the boat when wafers are loaded/unloaded to and from the process chamber after one process is completed.

Accordingly, in order to reduce or prevent the "slip" phenomenon, the manufacturing processes for semiconductor wafers have been modified so as to minimize these contributing factors, thereby resulting in decreased production yield of semiconductor devices.

Furthermore, the larger the contact surface between the wafer and the boat the more fine scratches occur, and the more frequently "slip" occurs. Accordingly, a large contact surface causes serious defects on the wafer, and reduces the usable area on the wafer.

SUMMARY OF THE INVENTION

The present invention is directed to a boat for semiconductor wafers, which substantially overcomes one or more problems due to the limitations and the disadvantages of the related art.

One object of the present invention is to provide a boat for semiconductor wafers for preventing scratches on the surface of the wafer, and thus preventing slip, thereby improving the productivity and the production yield of semiconductor devices. As used herein, "slip" refers to crystal dislocation, wafer surface distortion, or cracks in the wafer.

To achieve these and other advantages and in accordance with the purpose of the present invention, as embodied and broadly described, the boat for semiconductor wafers comprises: an upper member; a lower member, a plurality of wafers being loaded between the upper member and the lower member; a plurality of support members vertically extended between and connecting the upper member to the lower member for supporting the wafers; and a plurality of slots successively and horizontally formed in each of the support members, each slot having a hemisphere-shaped protrusion formed therein, wherein a peripheral edge of a wafer is inserted into the slot such that a bottom surface of the wafer contacts and is supported by the hemisphere-shaped protrusion.

In another aspect of the present invention, the boat for semiconductor wafers comprises: an upper member; a lower member, a plurality of wafers being loaded between the upper member and the lower member; a plurality of support members vertically extended between and connecting the upper member to the lower member for supporting the wafers; and a plurality of ring-shaped mounting plates vertically stacked and supported between the support members at a constant interval from each other, each ring-shaped mounting plate having a ring-shaped protrusion formed thereon, the ring-shaped protrusions having semicircular-shaped cross-sections, wherein a bottom surface of a wafer inserted between two adjacent mounting plates contacts and is supported by the ring-shaped protrusion.

In still another aspect of the present invention, the boat for semiconductor wafers comprises: an upper member; a lower member, a plurality of wafers being loaded between the upper member and the lower member; a plurality of support members vertically extended between and connecting the upper member to the lower member for supporting the wafers; and a plurality of ring-shaped mounting plates vertically stacked and supported between the support members at a constant interval from each other, each ring-shaped mounting plate having a plurality of hemisphere-shaped protrusions formed thereon, wherein a bottom surface of a wafer inserted between two adjacent mounting plates contacts and is supported by the hemisphere-shaped protrusions.

It is to be understood that both the foregoing general description and the following detailed description are exemplary and explanatory and are intended to provide further explanation of the invention as claimed.

BRIEF DESCRIPTION OF THE ATTACHED DRAWINGS

These and other objects, features and advantages of the present invention will be described with reference to the accompanying drawings, which are included to provide a further understanding of the invention and are incorporated in and constitute a part of this specification, in which.

DETAILED DESCRIPTION OF THE ATTACHED DRAWINGS

Preferred embodiments of the present invention will now be described in detail with reference to the accompanying drawings.

Figure 1:
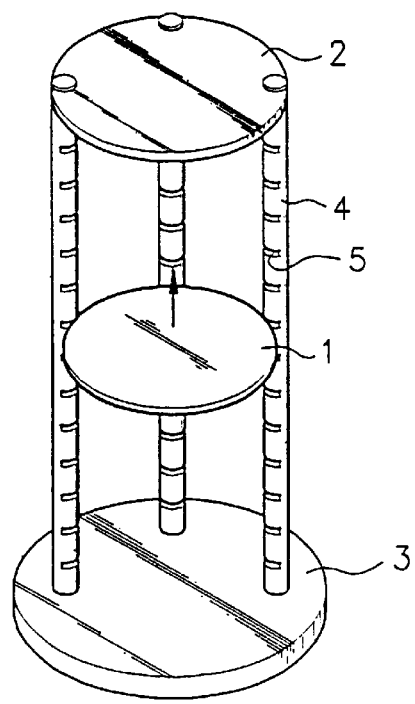
FIG. 1 is a perspective view showing a conventional boat for semiconductor wafers.
Figure 2:
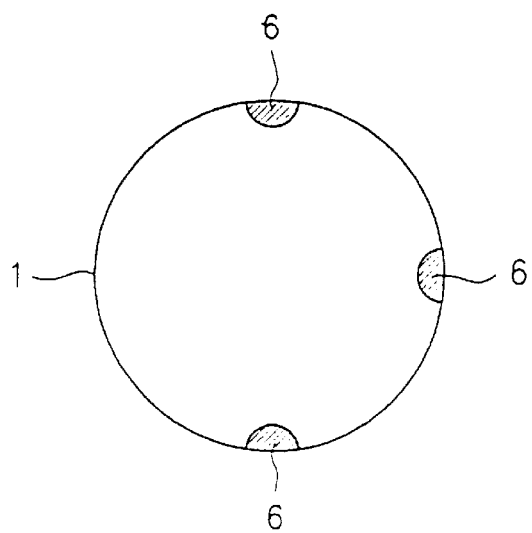
FIG. 2 shows the bottom of the wafer depicting the contact surface of the wafer loaded on the boat in FIG. 1.
Figure 3:
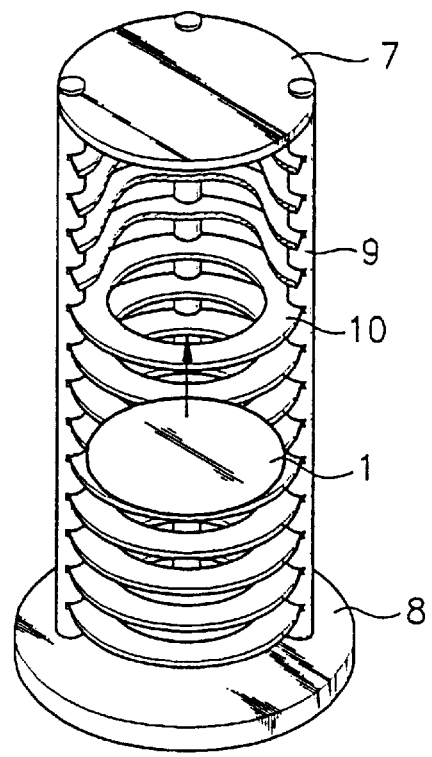
FIG. 3 is a perspective view showing another conventional boat for semiconductor wafers.
Figure 4:
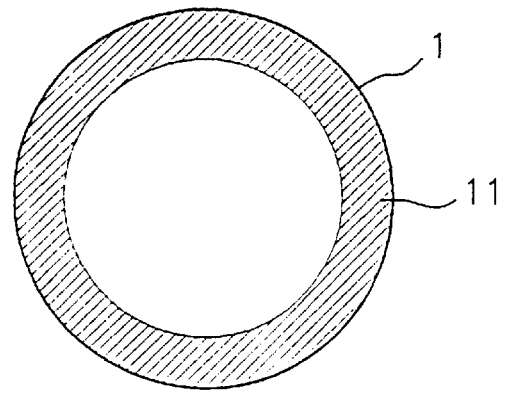
FIG. 4 shows the bottom of the wafer depicting the contact surface of the wafer loaded on the boat in FIG. 3.
Figure 5:
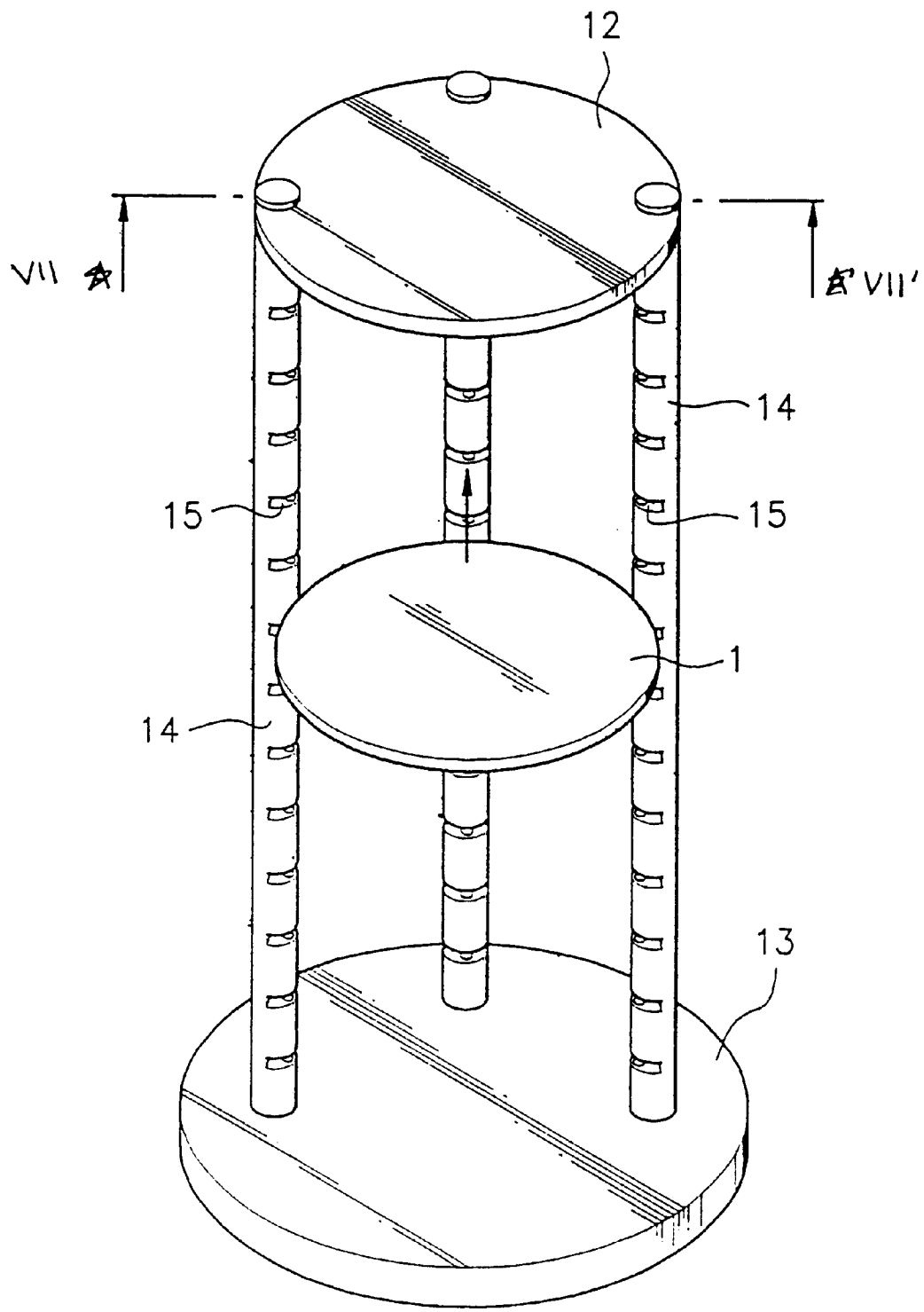
FIG. 5 is a perspective view showing a boat for semiconductor wafers according to one embodiment of the present invention.
Figure 6:
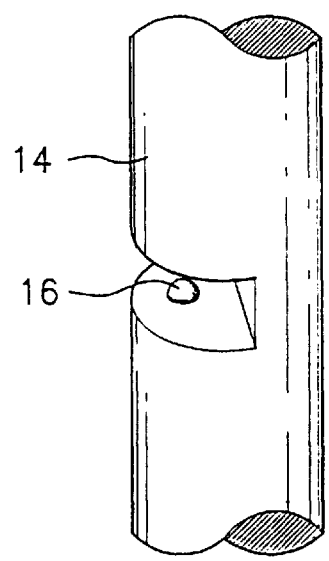
FIG. 6 is a partially enlarged view showing a hemisphere-shaped protrusion in FIG.5.

Referring to FIGS. 5 and 6, the boat comprises an upper member 12 and a lower member 13, between which a plurality of wafers are loaded. Preferably, three support members 14 vertically extend between and connect the upper member 12 to the lower member 13. Of course four or more support members 14 may be utilized, so long as there is sufficient space to insert the wafer between at least two of the support members 14. A plurality of slots 15 are formed in each of the support members 14, and the wafer 1 is supported at its peripheral edge after being inserted into the slot 15. A hemisphere-shaped protrusion 16 is formed inside each slot 15 on the lower surface thereof, such that the hemisphere-shaped protrusion contacts the bottom of the wafer 1.

Figure 8:
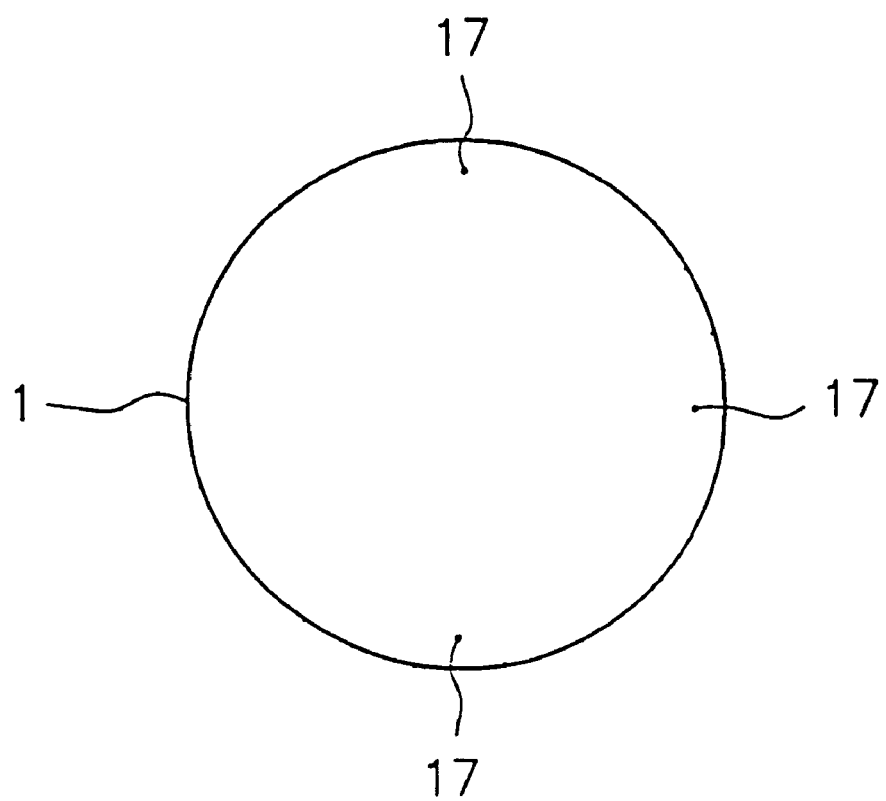
FIG. 8 shows the bottom of the wafer depicting the contact point of the wafer loaded on the boat in FIG. 5.

The hemisphere-shaped protrusion 16, which contacts the bottom of the wafer 1, has a hemispherical outer surface, such that a wafer inserted into the slots 15 contacts three hemisphere-shaped protrusions 16 at three contact points 17 as shown in FIG. 8.

If the radius of curvature of the hemispheric outer surface of the hemisphere-shaped protrusion 16 is too small, scratches may occur on the surface of the wafer 1. On the other hand, if the radius of curvature is too large, circulation of heated air around the hemisphere-shaped protrusion 16 at the contact points 17 is impeded. Considering such factors as the weight, strength, hardness, size etc. of the wafer 1, one of ordinary skill in the art could readily determine without undue experimentation, the optimum radius of curvature of the hemispheric outer surface of the hemisphere-shaped protrusion 16. In the illustrated embodiment, the radius of curvature of the hemisphere-shaped protrusion 16 is on the order of 2 mm to 5 mm.

Figure 7:
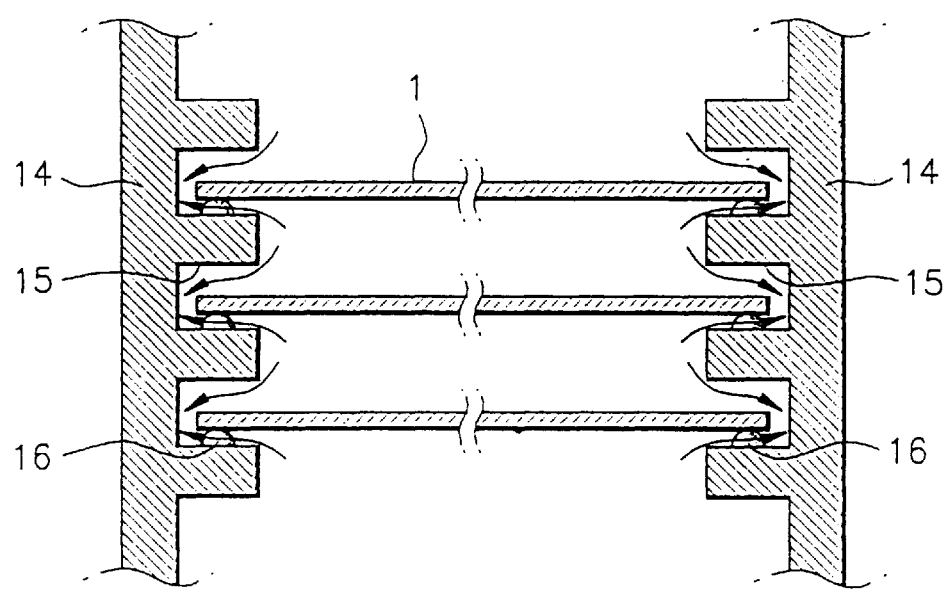
FIG. 7 is a partial cross section taken along the line VII–VII' in FIG. 5.

As a result, as shown in FIG. 7, heated air generated in a high temperature process chamber circulates through the space around the hemisphere-shaped protrusion 16 uniformly along the top and bottom of the wafer 1, especially around the slots 15. Therefore, thermal stress generated on the top and bottom of the wafer 1 due to abrupt thermal changes is released, and also, "slip" is prevented by reducing the contact surface between the wafer and the support member 14, which have different thermal expansion coefficients.

The hemisphere-shaped protrusion 16 can be formed by a cutting process when forming the slots 15 inside the support member 14, or can be formed by means of an injection-molding or a press process. Or, the hemisphere-shaped protrusion 16 can be welded onto the slot 15 of the support member 14, after making the hemisphere-shaped protrusion 16 from the same material as the support member 14, and then annealing to prevent breakage due to thermal expansion. In order to improve adhesion at the weld between the support member 14 and the hemisphere-shaped protrusion 16, preferably a groove (not shown) is formed in the surface of the slot 15, wherein the hemisphere-shaped protrusion 16 is inserted into the groove, and the groove is shaped to mesh with the bottom of the hemisphere-shaped protrusion 16.

The hemisphere-shaped protrusion 16 of the boat for semiconductor wafers according to this embodiment of the present invention can be applied to other types of boats for semiconductor wafers within the scope of this invention.

Figure 9:
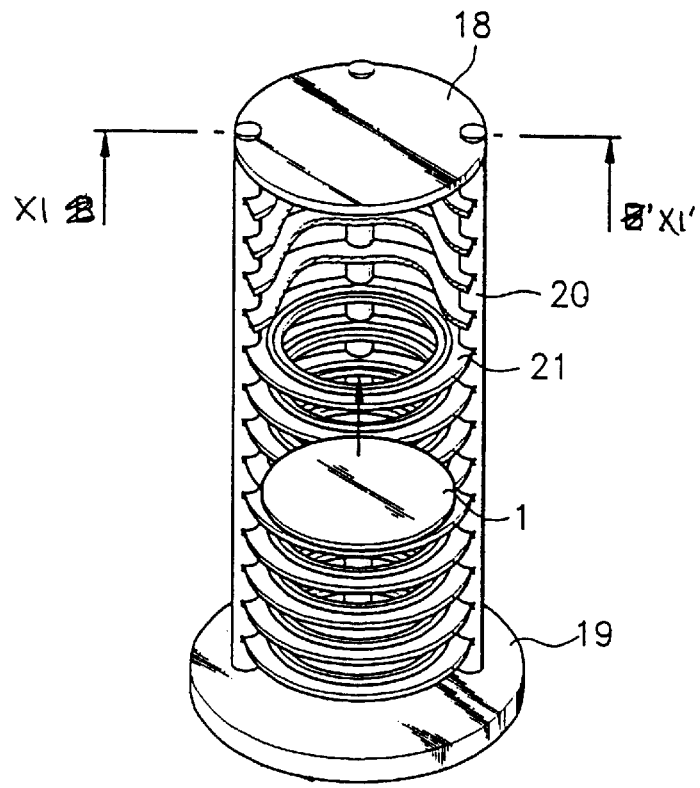
FIG. 9 is a perspective view showing a boat for semiconductor wafers according to another embodiment of the present invention.
Figure 10:
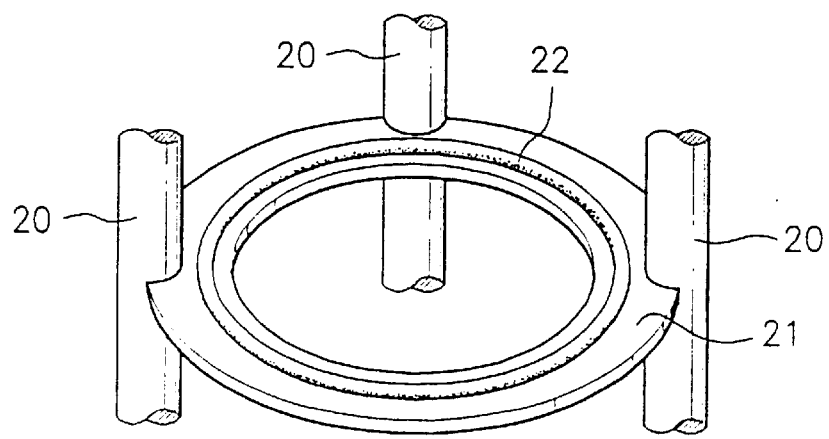
FIG. 10 is a partially enlarged view showing a ring-shaped protrusion of FIG. 9.
Figure 11:
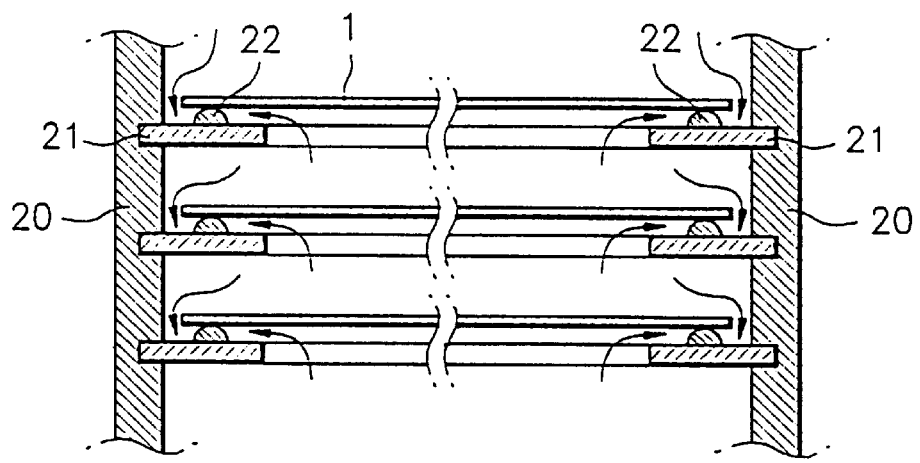
FIG. 11 is a partial cross section taken along the line XI–XI' in FIG. 9.

FIG. 9 shows a boat for semiconductor wafers according to another embodiment of the present invention. Referring to FIGS. 9 and 10, the boat comprises an upper member 18 and a lower member 19, between which a plurality of wafers 1 are loaded. Three, and possibly more, support members 20 vertically extend between and connect the upper member 18 to the lower member 19. A plurality of ring-shaped mounting plates 21 are vertically stacked and supported within recesses in the support members, wherein the ring-shaped mounting plates 21 are spaced at a constant interval from each other for supporting the wafers 1. A ring-shaped protrusion 22 is formed on each mounting plate 21 and has a semicircular-shaped cross section as shown in FIG. 11.

The mounting plate 21 prevents the wafer 1 from bending or deforming at high temperatures, and in the present invention, the ring-shaped protrusion 22 is formed on the mounting plate 21 so as to reduce the contact surface of the bottom surface of the wafer 1 on the mounting plate 21.

Figure 12:
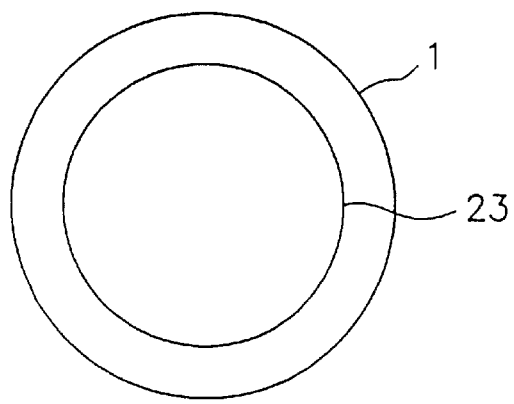
FIG. 12 shows the bottom of the wafer depicting the contact line of the wafer loaded on the boat in FIG. 9.

The ring-shaped protrusion 22 contacts the bottom surface of the wafer 1 at a contact line, and as shown in FIG. 12, the contact line is a ring-shaped contact line 23. The contact line 23 is formed at a constant radius from the center of the bottom of the wafer 1, thereby preventing the wafer 1 from bending or deforming under high temperature processing conditions.

The smaller the radius of the contact line 23, the less bending at the center of the wafer. However, if the radius of the contact line 23 is too small, the wafer 1 tends to bend at its peripheral edge. The radius of the ring-shaped protrusion 22 is thus optimized to minimize bending and deformation. Considering such factors as the weight, strength, hardness, size etc. of the wafer 1, one of ordinary skill in the art could readily determine without undue experimentation, the optimum radius of the contact line 23.

In addition, if the radius of curvature of the semicircular-shaped cross section of the ring-shaped protrusion 22 is too small, scratches may occur on the surface of the wafer 1. On the other hand, if the radius of curvature is too large, circulation of heated air around the ring-shaped protrusion 22 and the contact line 23 with the wafer 1 is impeded.

Therefore, the ring-shaped protrusion 22 should be designed considering all of the above factors so that the heated air generated in a high temperature process chamber uniformly reaches the top and bottom of the wafer 1, especially around the mounting plate 21. As before, considering such factors as the weight, strength, hardness, size etc. of the wafer 1, one of ordinary skill in the art could readily determine without undue experimentation, the optimum radius of curvature of the semicircular-shaped cross section of the ring-shaped protrusion 22. In the illustrated embodiment, the radius of curvature of the ring-shaped protrusion 22 is on the order of 2 mm to 5 mm.

Therefore, the thermal stress generated on the top and bottom of the wafer 1 due to abrupt thermal changes can be released, and "slip" can be prevented by reducing the contact surface between the mounting plate 21 and the wafer 1, having different thermal expansion coefficients.

The ring-shaped protrusion 22 can be formed by a cutting process when forming the mounting plate 21, or can be formed by means of an injection-molding or a press process. Alternatively, the ring-shaped protrusion 22 can be welded onto the mounting plate 21 of the support member 20 after making the ring-shaped protrusion 22 of the same material as the mounting plate 21, and then annealing to prevent breakage due to thermal expansion.

In order to improve the adhesion between the mounting plate 21 and the ring-shaped protrusion 22, before welding, preferably a groove (not shown) is formed on the mounting plate 21, the groove being shaped to mesh with the bottom of the ring-shaped protrusion 22.

The ring-shaped protrusion 22 of the boat for semiconductor wafers according to this embodiment of the present invention can be applied to other types of boats for semiconductor wafers within the scope of this invention.

Figure 13:
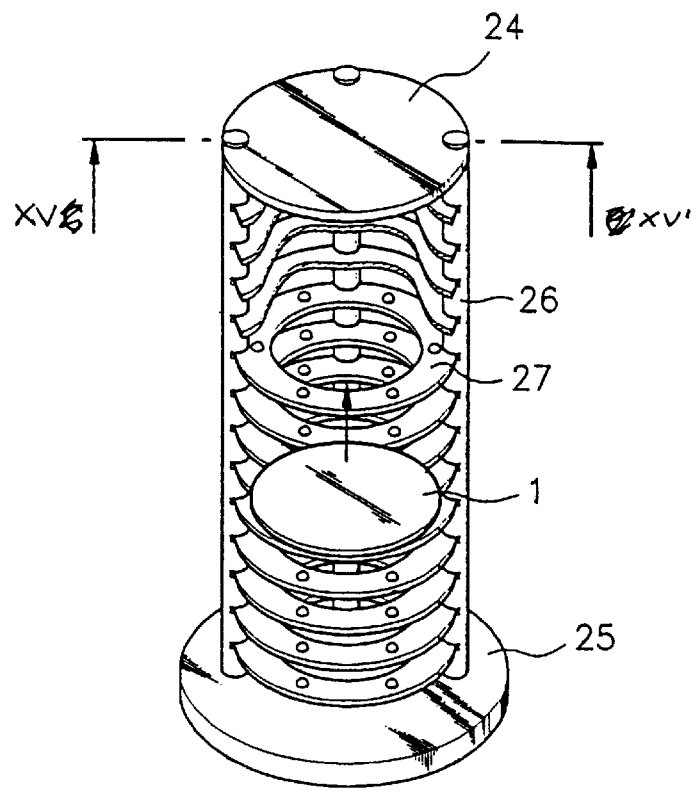
FIG. 13 is a perspective view showing a boat for semiconductor wafers according to still another embodiment of the present invention.
Figure 14:
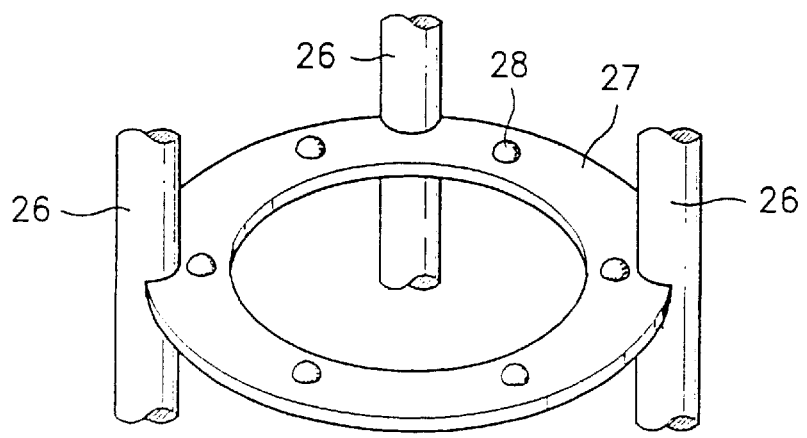
FIG. 14 is a partially enlarged view showing a hemisphere-shaped protrusion of FIG. 13.
Figure 15:
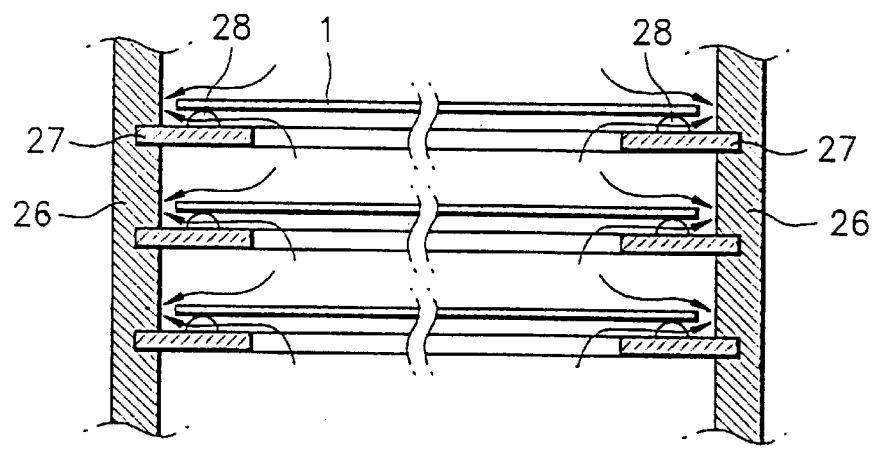
FIG. 15 is a partial cross section taken along the line XV–XV' in FIG. 13.

FIG. 13 shows a boat for semiconductor wafers according to still another embodiment of the present invention. Referring to FIGS. 13 and 14, the boat comprises an upper member 24 and a lower member 25, between which a plurality of wafers 1 are loaded. Three, and possibly more, support members 26 vertically extend between and connect the upper member 24 to the lower member 25. A plurality of ring-shaped mounting plates 27 are vertically stacked and supported within recesses in the support members 26, wherein the ring-shaped mounting plates 27 are spaced at a constant interval from each other for mounting the wafers 1. As shown in FIG. 13, six hemisphere-shaped protrusions 28 are formed on each mounting plate 27, each hemisphere-shaped protrusion 28 having a hemisphere-shaped outer surface which contacts the bottom surface of the wafer 1. Although six hemisphere-shaped protrusions 28 are shown in FIG. 13, more or less hemisphere-shaped protrusions 28 may be provided. At least three hemisphere-shaped protrusions 28 should be provided, at equal spacing from each other, for stability. More than six hemisphere-shaped protrusions 28 could be provided as well.

Figure 16:
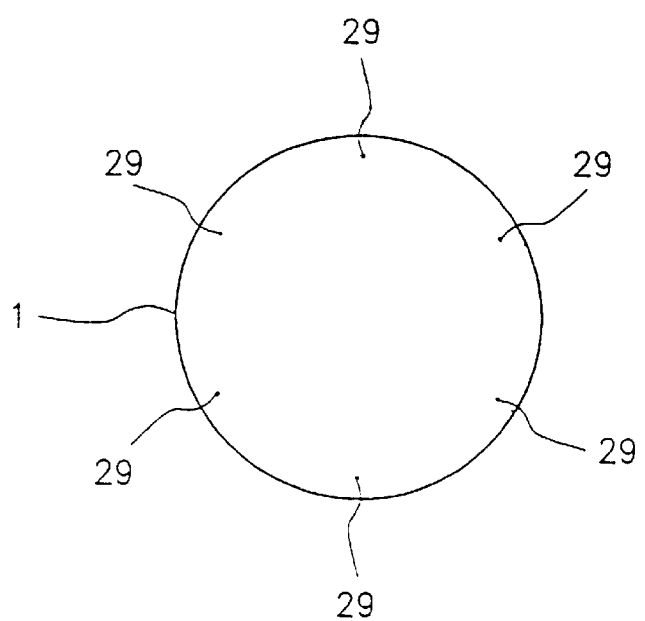
FIG. 16 shows the bottom of the wafer depicting the contact point of the wafer loaded on the boat in FIG. 13.

The ring-shaped mounting plate 27 is designed to prevent the wafer 1 from bending or deforming under high temperature processing conditions. Furthermore, by providing the hemisphere-shaped protrusions 28 on the ring-shaped mounting plate 27, the contact surface between the wafer 1 and the mounting plate 27 is reduced. The contact surface between the bottom surface of the wafer 1 and the hemisphere-shaped protrusions 28 is six contact points 29 as shown in FIG. 16.

The contact points 29 are formed along the periphery of the bottom of the wafer 1 at an equal interval from each other, and the hemisphere-shaped protrusions 28 support the wafer 1 so as to prevent the wafer 1 from bending or deforming under high temperature processing conditions. The smaller the radius of a circle connecting the contact points 29, the less bending at the center of the wafer; but if the radius of the circle is too small, the wafer 1 tends to bend at its peripheral edge.

In addition, the larger the interval distance between adjacent contact points 29 (i.e., the fewer hemisphere-shaped protrusions 28 there are on the ring-shaped mounting plate 27), the more the wafer 1 is deformed. On the other hand, the smaller the interval distance between adjacent contact points 29 (i.e., the more hemisphere-shaped protrusions 28 there are on the ring-shaped mounting plate 27), the greater is the impedance to the circulation of heated air. Also, the more hemisphere-shaped protrusions 28 there are on the ring-shaped mounting plate 27, the greater the expense for the fabrication of the ring-shaped mounting plate 27.

In addition, if the radius of curvature of the hemisphere-shaped protrusion 28 is too small, scratches may occur on the surface of the wafer 1. On the other hand, if the radius of curvature of the hemisphere-shaped protrusion 28 is too large, the circulation of heated air around each of the contact points 29 and the wafer 1 is impeded.

Therefore, the number of hemisphere-shaped protrusions 28, the radius of the placement thereof (i.e. the radius of a circle connecting the protrusions 28), and the radius of curvature of the hemisphere-shaped protrusion 28, can be optimized considering the weight, strength, hardness, size etc., of the wafer 1, the deformation thereof, and the circulation of heated air. As before, one of ordinary skill in the art could readily determine such parameters without undue experimentation.

Therefore, the flow of heated air generated in the high temperature process chamber uniformly reaches the top and bottom of the wafer 1, especially around the ring-shaped mounting plate 27. Thus, the thermal stress generated on the top and bottom of the wafer 1 due to the abrupt thermal changes can be released, and also, "slip" can be prevented by reducing the contact surface between the ring-shaped mounting plate 27 and the wafer having different thermal expansion coefficients.

The hemisphere-shaped protrusion 28 can be formed by a cutting process when forming the ring-shaped mounting plate 27, or can be formed by means of an injection-molding or a press process. Or, the hemisphere-shaped protrusion 28 can be welded onto the ring-shaped mounting plate 27 after making the hemisphere-shaped protrusion 28 of the same material as the ring-shaped mounting plate 27, and then annealing to prevent breakage due to thermal expansion.

In order to improve the adhesion of the ring-shaped mounting plate 27 and the hemisphere-shaped protrusion 28, before welding, preferably a groove (not shown) is formed on the ring-shaped mounting plate 27, the groove being shaped to mesh with the bottom of the hemisphere-shaped protrusion 28.

In addition, the hemisphere-shaped protrusions 28 are preferably formed equally spaced on each ring-shaped mounting plate 27, the preferable number of hemisphere-shaped protrusions being from 3 to 12.

The hemisphere-shaped protrusion 28 of the boat for semiconductor wafers according to this embodiment of the present invention can be applied to other types of boats for semiconductor wafers within the scope of this invention.

Therefore, according to the boats for semiconductor wafers of the embodiments of the present invention, the generation of fine scratches on the surface of the wafer can be reduced, and also, "slip" can be minimized by changing the conventional support of the wafer from a contact surface to a contact line or contact points.

Accordingly, because "slip" is prevented efficiently, the processing under high temperatures is easy, and the speed for heating a process chamber can be increased. Further, more pieces of the wafers can be loaded because the gap between the slots of the boat can be formed narrowly, and the loading and unloading of the boat can be made rapidly.

It will be apparent to those skilled in the art that various modifications and variations of the present invention can be made without departing from the spirit or scope of the invention. Thus, it is intended that the present invention cover the modifications and variations of this invention provided they come within the scope of the appended claims and their equivalents.

What is claimed is:

1. A boat for housing semiconductor wafers comprising:
   an upper member;
   a lower member;
   a plurality of support members vertically extended between and connecting the upper member to the lower member for supporting the wafers; and
   a plurality of slots successively and horizontally formed in each of the support members, each slot having a hemisphere-shaped protrusion formed on a lower surface thereof, wherein a peripheral edge of a wafer is inserted into the slot such that a bottom surface of the wafer contacts and is supported by the hemisphere-shaped protrusion.

2. The boat for semiconductor wafers of claim 1, wherein the hemisphere-shaped protrusion and the support member are made of a common material.

3. The boat for semiconductor wafers of claim 1, wherein the hemisphere-shaped protrusion is welded into the slot of the support member.

4. A boat for housing semiconductor wafers comprising:
   an upper member;
   a lower member;
   a plurality of support members vertically extended between and connecting the upper member to the lower member for supporting the wafers; and
   a plurality of ring-shaped mounting plates vertically stacked and supported between the support members at a constant interval from each other, each ring-shaped mounting plate having an upper base surface, and a protrusion protruding from said upper base surface and extending along said upper base surface as a ring encircling a central area of the boat, the ring-shaped protrusion of each of said mounting plates having a semicircular cross section so as to provide an annular line of contact at the top thereof, wherein a bottom surface of a wafer inserted between two adjacent mounting plates contacts and is supported by the annular line of contact provided at the top of the ring-shaped protrusion.

5. The boat for semiconductor wafers of claim 4, wherein the ring-shaped protrusion and the ring-shaped mounting plate are made of a common material.

6. The boat for semiconductor wafers of claim 4, wherein the ring-shaped protrusion is welded onto the ring-shaped mounting plate.

* * * * *